(12) United States Patent
Otsubo et al.

(10) Patent No.: US 6,483,287 B2
(45) Date of Patent: Nov. 19, 2002

(54) WAVEFORM MEASURING APPARATUS

(75) Inventors: Toshinobu Otsubo, Atsugi (JP); Akihito Otani, Atsugi (JP); Hiroto Watanabe, Atsugi (JP)

(73) Assignee: Anritsu Corporation, Tokyo (JP)

( * ) Notice: Subject to any disclaimer, the term of this patent is extended or adjusted under 35 U.S.C. 154(b) by 0 days.

(21) Appl. No.: 09/924,331

(22) Filed: Aug. 8, 2001

(65) Prior Publication Data

US 2002/0017901 A1 Feb. 14, 2002

(30) Foreign Application Priority Data

Aug. 10, 2000 (JP) .................................. 2000-242865

(51) Int. Cl.[7] .............................................. G01R 23/02
(52) U.S. Cl. ............................. 324/76.39; 324/76.41; 324/76.42
(58) Field of Search .................... 324/76.39, 76.41, 324/76.42, 76.52, 76.53, 76.55, 76.58, 76.77, 85; 331/14, 25; 375/134; 455/76, 255, 260

(56) References Cited

U.S. PATENT DOCUMENTS

| | | | | |
|---|---|---|---|---|
| 4,868,523 A | * | 9/1989 | Petersson | 331/14 |
| 5,184,093 A | * | 2/1993 | Itoh et al. | 331/25 |
| 5,805,871 A | * | 9/1998 | Baxter | 395/555 |
| 6,167,245 A | * | 12/2000 | Welland et al. | 455/260 |
| 6,407,686 B1 | * | 6/2002 | Otani et al. | 341/120 |

* cited by examiner

Primary Examiner—Christine K. Oda
Assistant Examiner—Etienne LeRoux
(74) Attorney, Agent, or Firm—Frishauf, Holtz, Goodman & Chick, P.C.

(57) ABSTRACT

A frequency synthesized signal generator outputs a frequency synthesized signal having a frequency equal to a repetition frequency of a signal under test by employing a reference signal. A phase comparator detects a phase difference between a phase of the frequency synthesized signal and a phase of the signal under test, and outputs a phase difference signal. A voltage control oscillator generates a reference signal phase-synchronized with the signal under test based on the phase difference signal output from the phase comparator, and feeds the reference signal back to the frequency synthesized signal generator. A sampling signal generator circuit generates a sampling signal applied to a sampling section by employing the reference signal output from the voltage control oscillator.

24 Claims, 7 Drawing Sheets

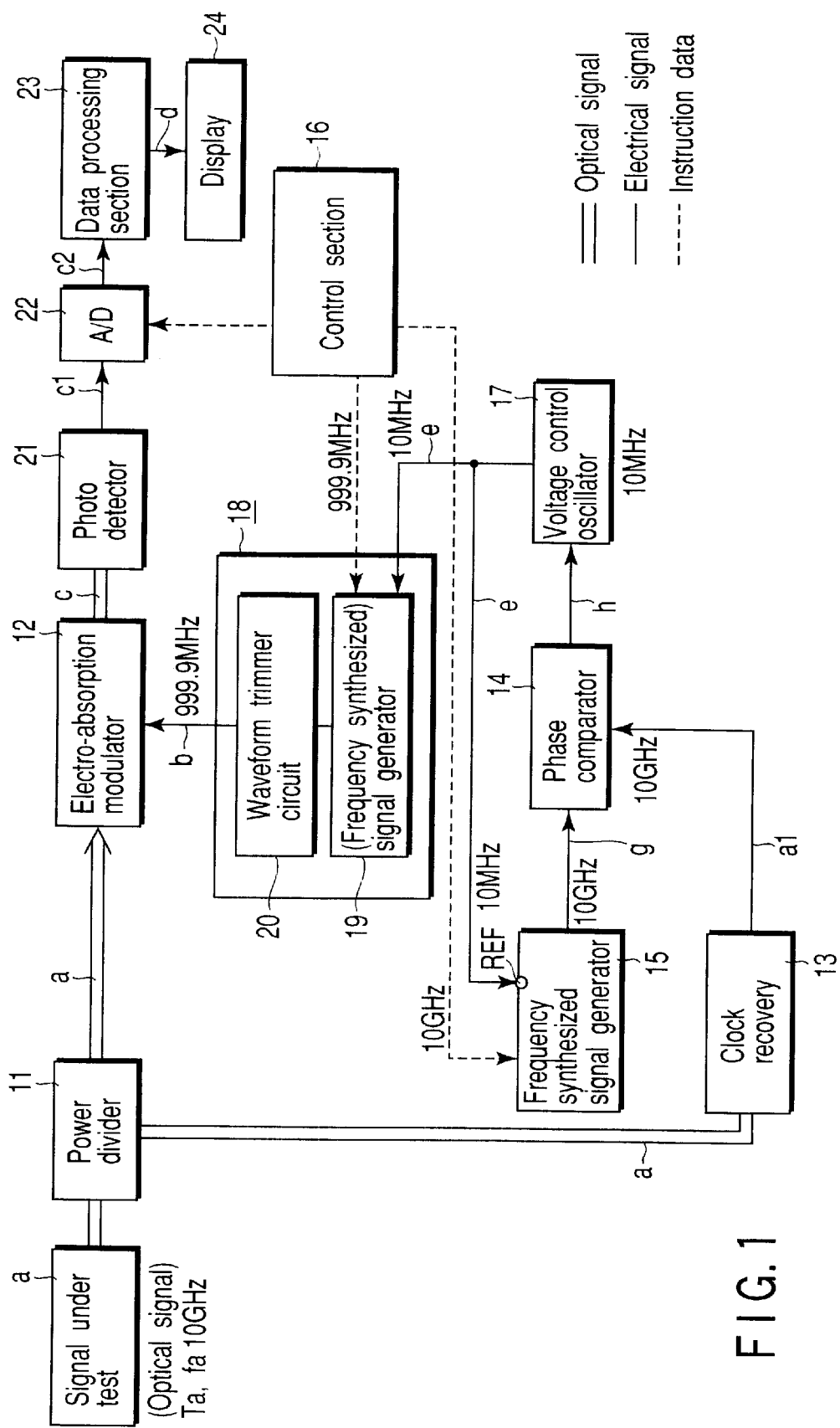
F I G. 1

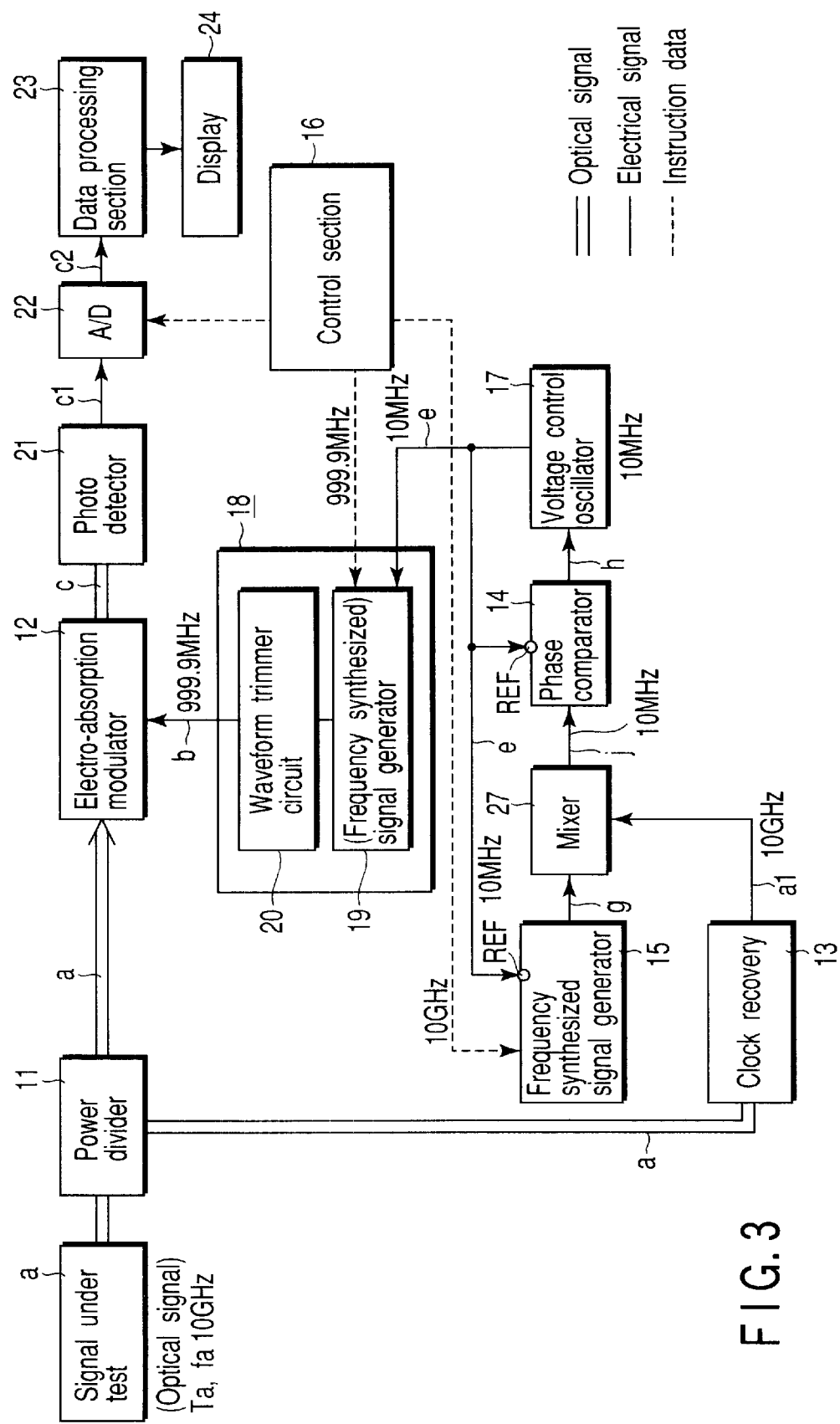
F I G. 3

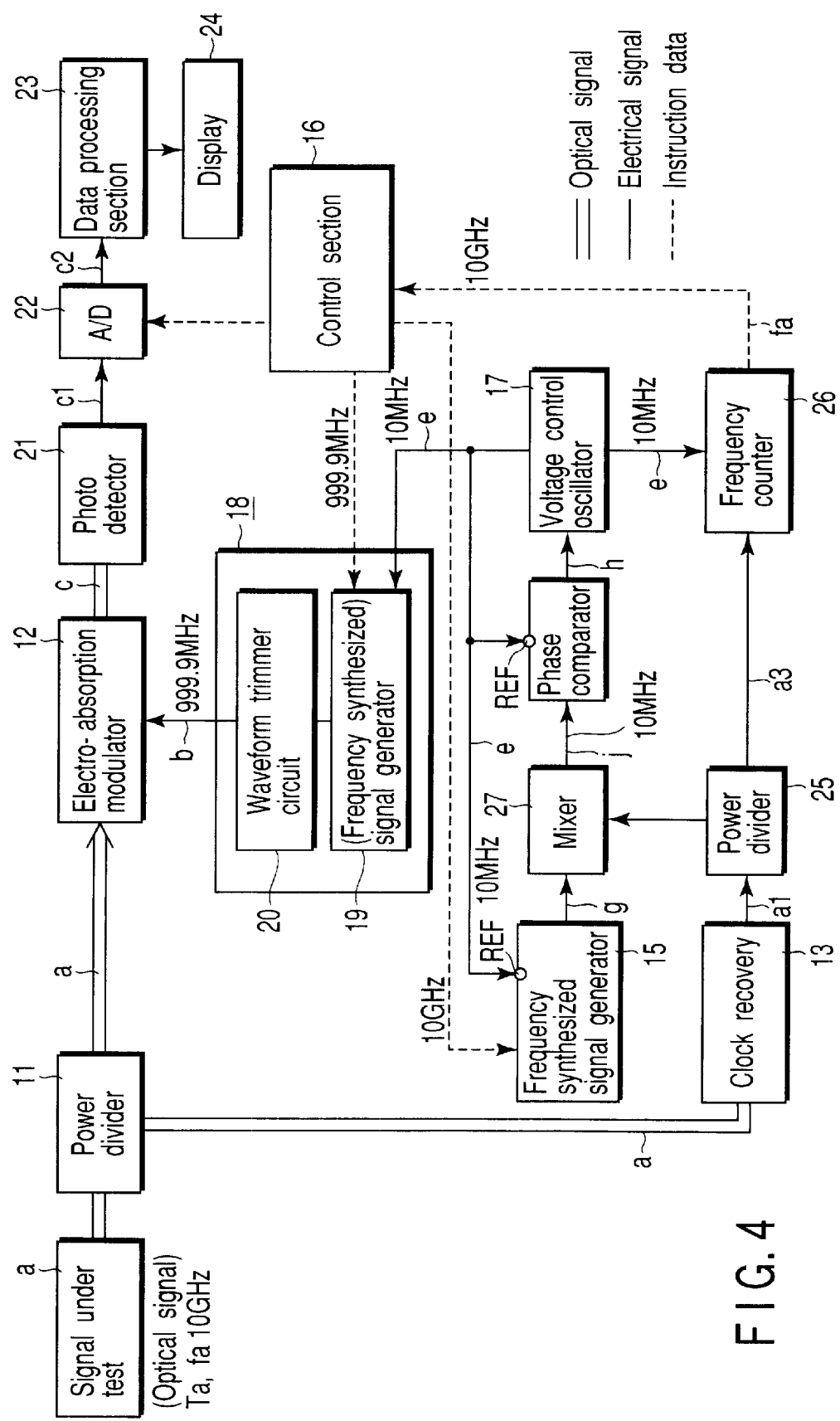
F I G. 4

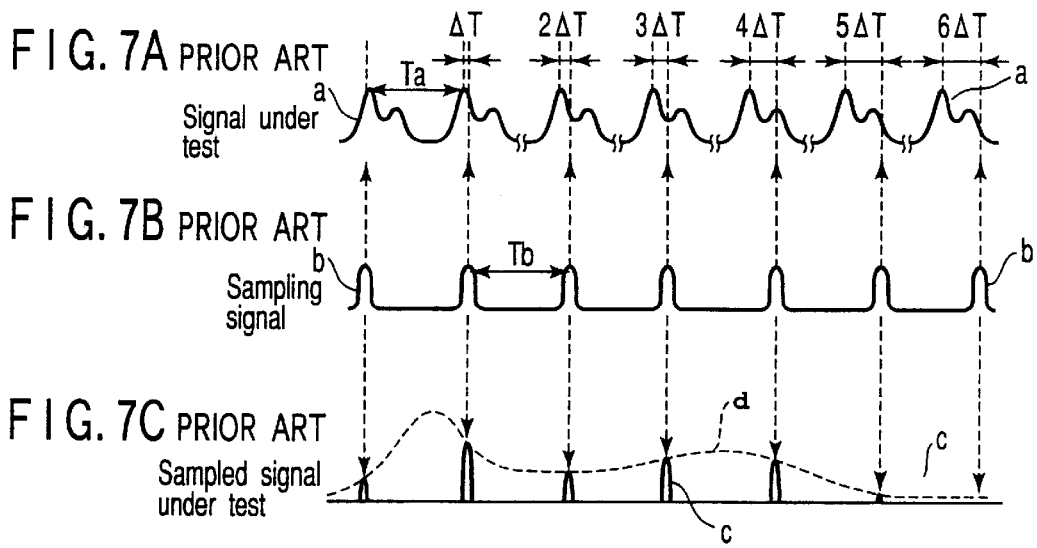
FIG. 7A PRIOR ART Signal under test
FIG. 7B PRIOR ART Sampling signal
FIG. 7C PRIOR ART Sampled signal under test
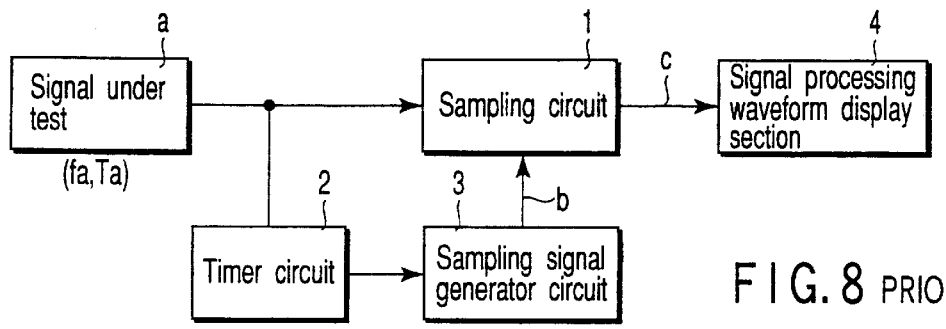
FIG. 8 PRIOR ART
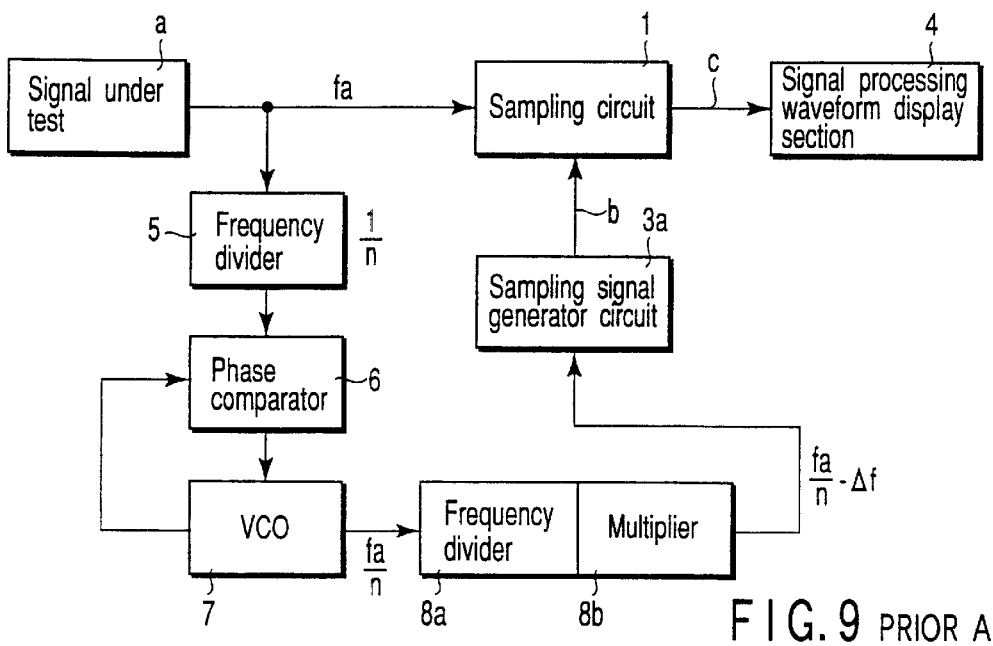
FIG. 9 PRIOR ART

WAVEFORM MEASURING APPARATUS

CROSS-REFERENCE TO RELATED APPLICATIONS

This application is based upon and claims the benefit of priority from the prior Japanese Patent Application No. 2000-242865, filed Aug. 10, 2000, the entire contents of which are incorporated herein by reference.

BACKGROUND OF THE INVENTION

1. Field of the Invention

The present invention relates to a waveform measuring apparatus. More particularly, the present invention relates to a waveform measuring apparatus for measuring a signal waveform of a signal under test having an input arbitrary repetition cycle.

2. Description of Related Art

Conventionally, there have been proposed a variety of measuring techniques for measuring a signal waveform of a signal under test such as an electrical signal or an optical signal and the like having an input arbitrary repetition cycle.

However, in the case of a high frequency synthesized signal of which a repetition cycle of a signal under test, i.e., a repetition frequency exceeds 10 GHz, the signal waveform of the signal under test cannot be directly observed on a display screen of an oscilloscope or the like. Thus, the selection range of such waveform measuring technique is limited itself.

A conventional typical technique for measuring a signal waveform of a signal under test of which the repetition frequency exceeds 10 GHz will be described with reference to FIGS. 7A, 7B, and 7C.

As shown in FIGS. 7A and 7B, a signal under test "a" having a repetition cycle Ta (for example, repetition frequency fa=10 GHz) is sampled by means of a sampling signal "b" having a cycle Tb (for example, repetition frequency "fb"=999.9 MHz) longer than the repetition cycle Ta of this signal under test "a".

In this case, a mutual relationship between the repetition cycle Ta of the signal under test "a" and the cycle Tb that is longer than the repetition cycle Ta of the signal under test "a" is adjusted. As shown in FIGS. 7A and 7B, with an elapse of time, a sampling position of the sampling signal "b" in the signal waveform in the repetition cycle Ta of the signal under test "a" is shifted by a very small amount of time ΔT, so that the time is delayed by 2ΔT, 3ΔT, 4ΔT, 5ΔT, 6ΔT, . . . nΔT.

Therefore, a signal under test "c" after sampled by this sampling signal "b" is obtained as a discrete waveform of which a pulse shaped waveform is generated at a position synchronized with the sampling signal "b", as shown in FIG. 7C.

Then, the enveloped waveform of such each pulse waveform is obtained as a signal waveform "d" extended in a time axis direction of the signal under test "a".

Based on the sampling technique shown in FIGS. 7A, 7B, and 7C, a waveform measuring apparatus for measuring a signal waveform "d" of the signal under test "a" is configured as shown in FIG. 8.

The signal under test "a" having the repetition cycle Ta (repetition frequency "fa") is input to a sampling circuit 1 and a timer circuit 2.

The timer circuit 2 outputs a timing of generating each pulse of the sampling signal "b" to a sampling signal circuit 3.

In this case, the timing of generating each pulse of the sampling signal "b" is required to be shifted by ΔT from a start time of the repetition cycle Ta of the signal under test "a", and thus, is synchronized with the signal under test "a" having an input reference time signal.

The sampling signal generator circuit 3 applies to the sampling circuit 1 a sampling signal "b" having a pulse form every time a pulse generation timing is input from the timer circuit 2.

The sampling circuit 1 samples the input signal under test "a" by means of the sampling signal "b" input from the sampling signal generator circuit 3, and delivers the sampled signal under test "c" to a signal processing/waveform display section 4.

The signal processing/waveform display section 4 calculates an enveloped waveform of the sampled signal under test "c", converts a scale of the time axis of this enveloped waveform to a scale of the original signal under test "a", and displays and outputs a signal waveform "d" of the signal under test "a".

FIG. 9 is a block diagram depicting a schematic configuration of another conventional waveform measuring apparatus for measuring a signal waveform "d" of a signal under test "a" by using a principle of the sampling technique shown in FIGS. 7A, 7B, and 7C.

The signal under test "a" having the repetition frequency "fa" (repetition cycle Ta) is input to the sampling circuit 1 and a frequency divider 5.

The frequency divider 5 divides the repetition frequency "fa" of the signal under test "a" by 1/n, and delivers it to a phase comparator 6.

A voltage control oscillator (VCO) 7 generates a signal having a frequency (fa/n) that is 1/n (n: positive integer) of the repetition frequency "fa", and feeds it back to the phase comparator 6.

The phase comparator 6 detects a phase difference between a phase of an output signal of the voltage control oscillator and a phase of an output signal of the frequency divider 5, and delivers the phase difference signal to the voltage control oscillator (VCO).

By means of such a phase synchronization loop (PLL), the phase of the output signal from the voltage control oscillator (VCO) 7 is controlled so as to be synchronized with the phase of the signal under test "a".

An output signal having a frequency (fa/n) output from the voltage control oscillator (VCO) 7 is converted into a frequency of (fa/n)−Δf by means of a next frequency divider 8a having a fixed rate of frequency dividing and a multiplier 8b having a fixed rate of frequency multiplying, and the converted signal is input to a sampling signal generator circuit 3a.

The sampling signal generator circuit 3a applies to the sampling circuit 1 the sampling signal "b" having a repetition frequency synchronized with an $$\text{input signal } fb=(fa/n)-\Delta f \quad (1)$$

and a repetition $$\text{cycle of } Tb=(nTa)+\Delta T \quad (2).$$

However, a relationship between Δf and ΔT is approximately shown by the formula below.

$$\Delta f/\Delta T = fa^2/n^2 \quad (3)$$

The sampling circuit 1 samples the input signal under test "a" by means of the sampling signal "b" input from the sampling signal generator circuit 3a, and delivers the sampled signal under test "c" to the signal processing/waveform display section 4.

The signal processing/waveform display section 4 calculates an enveloped waveform of the input, sampled signal under test "c", converts a scale of a time axis of this enveloped waveform into a scale of the original signal under test "a", and displays and outputs a signal waveform "d" of the signal under test "a".

In this case, a magnification rate of the signal under test "a" of the measured, enveloped waveform to the signal waveform "d" is defined as $(fa/n\Delta f)$ In the case where the signal under test "a" is obtained as an optical signal instead of an electrical signal, this optical signal is converted into an electrical signal, and the converted signal is applied to the timer circuit 2 or frequency divider 5.

In addition, in the case of the optical signal, an electro-absorption modulator is employed instead of the sampling circuit 1.

This electro-absorption modulator applies a pulse shaped electric field caused by a sampling signal to a forwarding direction of an incident optical signal, thereby making it possible to sample a pulse shaped signal under test "a" that consists of an input optical signal.

Then, the signal under test "c" such as the sampled optical signal is converted into an electrical signal, and the converted signal is delivered to the signal processing/waveform display section 4.

However, in a conventional measuring apparatus employing a sampling technique shown in FIGS. 8 and 9 as well, there has been the following problems to be solved.

That is, in the waveform measuring apparatus shown in FIG. 8, an output timing of a timing signal output by the timer circuit 2 is set by employing a reference time signal output from an oscillator provided in this timer circuit 2.

In this case, a reference time signal output from the oscillator and a reference signal for determining a repetition frequency Ta of the signal under test "a" are signals generated by means of different signal generators in view of hardware. Thus, the verified phases are not always coincident with each other at all the timings.

Thus, there is a problem that a large jitter occurs with the enveloped waveform of the signal under test "c" after sampled by means of the sampling circuit 1, and then, the measurement precision of the signal waveform "d" of the signal under test "a" is lowered.

For example, in the case where the repetition frequency Fa of the signal under test "a" is about 10 GHz, a quantity of generated jitter reaches several ps (pico-seconds). In addition, in the signal waveform "d" of the final signal under test "a" considering a bandwidth restriction of the photo detector and electrical processing circuit, the waveform tolerance reaches 10 ps to 20 ps.

Further, in the waveform measuring apparatus shown in FIG. 9, an output signal from the multiplier 8b for generating the sampling signal "b" having the repetition frequency fb=(fa/n)–Δf output from the sampling signal generator circuit 3a is generated by means of a PLL circuit composed of a frequency divider 5 for frequency dividing the signal under test "a", a phase comparator 6, and a voltage control oscillator (VCO) 7.

That is, in this case, the sampling signal "b" is generated by processing the signal under test "a" targeted to be measured. Thus, the sampling signal "b" is always phase synchronized with the signal under test "a".

Therefore, in the waveform measuring apparatus shown in FIG. 9, unlike the waveform measuring apparatus shown in FIG. 8, there is no need to additionally provide an oscillator for generating the sampling signal "b". Thus, a quantity of generated jitter is remarkably restrained.

However, the repetition frequency "fb" of the sampling frequency "b" is designates by a function of the repetition frequency "fa" of the signal under test "a", as is evident from the previously described formulas (1) and (3).

Thus, in the waveform measuring apparatus having a fixed rate of frequency dividing and a fixed rate of frequency multiplying, the repetition frequency "fb" of the sampling signal "b" cannot be arbitrarily set independently of the repetition frequency "fa" of the signal under test "a".

Namely, if the repetition frequency "fa" of the signal under test "a" changes, the time resolution of the signal waveform "d" of the measured, signal under test "a", i.e., measurement precision automatically changes.

This fact designates that the signal waveform "d" of the signal under test "a" cannot be measured by an arbitrary time resolution.

In addition, there is a problem that the selection range of the repetition frequency "fb" of the sampling signal "b" is significantly restricted due to the specification or characteristics of each of the frequency dividers 5 and 8a.

BRIEF SUMMARY OF THE INVENTION

The present invention has been made in order to solve the foregoing problem. It is an object of the present invention to provide a waveform measuring apparatus for generating a frequency synthesized signal for acquiring a frequency of a sampling signal by employing a frequency synthesized signal generator, and always phase synchronizing the thus generated frequency synthesized signal with a signal under test by employing a PLL technique, whereby a frequency of a sampling signal for sampling the signal under test can be arbitrarily set independent of a repetition frequency of the signal under test, the measurement precision of the signal waveform of the signal under test can be improved while a quantity of generated jitter is remarkably restrained, and the signal waveform can be measured with an arbitrary resolution precision.

The present invention is applicable to a waveform measuring apparatus for sampling a signal under test having an input arbitrary repetition cycle by means of a sampling signal having a cycle longer than the repetition cycle of this signal under test, obtaining an enveloped waveform of the thus sampled signal under test, and obtaining a signal waveform of the signal under test from the enveloped waveform.

According to a first aspect of the present invention, there is provided a waveform measuring apparatus having a sampling section (12) for sampling a signal under test having an input arbitrary repetition cycle by means of a sampling signal having a cycle longer than the repetition cycle of the signal under test and a data processing section (23) for obtaining an enveloped waveform of a signal under test sampled by means of the sampling section, and obtaining a signal waveform of the signal under test from the enveloped waveform, the waveform measuring apparatus comprising:

a frequency synthesized signal generator (15) having a reference signal input terminal (REF), the frequency synthesized signal generator outputting a frequency synthesized signal having a frequency equal to a repetition frequency of the signal under test by employing a reference signal applied to the reference signal input terminal;

a phase comparator (14) detecting a phase difference between a phase of the frequency synthesized signal output from the frequency synthesized signal generator and a phase of the signal under test, thereby outputting a phase difference signal;

a voltage control oscillator (17) for generating a reference signal phase synchronized with the signal under test based on the phase difference signal output from the phase comparator, and feeding the reference signal back to the reference signal input terminal of the frequency synthesized signal generator and the reference signal input terminal of the phase comparator; and a sampling signal generator circuit (18) for generating the sampling signal by employing a reference signal output from the voltage control oscillator.

In the thus configured waveform measuring apparatus, a sampling signal generated by a sampling signal generating circuit is generated based on a reference signal output from a voltage control oscillator.

Thus, the waveform measuring apparatus can be set to an arbitrary frequency independent of a repetition frequency of a signal under test by means of a frequency synthesized signal generator provided in the sampling signal generating circuit.

Furthermore, a phase of this reference signal is always phase synchronized with a phase of a signal under test by means of a PLL circuit composed of a frequency synthesized signal generator, a phase comparator, and a voltage control oscillator.

Therefore, a frequency of a sampling signal for sampling a signal under test can be arbitrarily set independent of a repetition frequency of a signal under test, and is always phase synchronized with the signal under test. Thus, an occurrence of a jitter is restrained.

In addition, in order to achieve the foregoing object, according to a second aspect of the present invention, there is provided a waveform measuring apparatus according to the first aspect, further comprising:

a frequency measuring section (26) for measuring a repetition frequency of the signal under test based on the reference signal output from the voltage control oscillator; and a frequency setting section (16) for setting a frequency of a frequency synthesized signal output from the frequency synthesized signal generator to the frequency synthesized signal generator based on a repetition frequency of the signal under test measured at the frequency measuring section.

In the thus configured waveform measuring apparatus, even if the repetition of a signal under test is unknown, this repetition frequency is measured by the frequency measuring section, and an output frequency synthesized signal of a frequency synthesized signal generator is automatically set based on the thus measured repetition frequency.

Therefore, even if the repetition frequency of the signal under test is unknown, the signal waveform of the signal under test can be precisely measured.

In addition, in order to achieve the foregoing object, according to a third aspect of the present invention, there is provided a waveform measuring apparatus according to the first aspect, further comprising:

a power divider (11) for power dividing the signal under test that is an optical signal in two ways, if the signal under test is the optical signal; and a clock recovery (13) for detecting a clock with its repetition cycle from one of the signal under test divided by the power divider, thereby outputting the signal under test that is the optical signal to be converted into a signal under test of an electrical signal of a sine waveform having the repetition frequency.

In addition, in order to achieve the foregoing object, according to a fourth aspect of the present invention, there is provided a waveform measuring apparatus according to the third aspect, further comprising:

a photo detector (21) for, when the sampling section is an electro-absorption modulator (12), light receiving a signal under test obtained by sampling a signal under test of the optical signal input from the power divider by means of a sampling signal input from the sampling signal generator circuit, and converting a signal under test that is an optical signal after sampled into a signal under test of an electrical signal;

an analog/digital converter (22) for converting the signal under test converted into the electrical signal by means of the photo detector into a digital signal under test, and delivering the converted digital signal under test to the data processing section; and a display (24) for converting a scale of a time axis of the enveloped waveform obtained by the data processing section into a scale of an original signal under test, and displaying a signal waveform of the signal under test.

In addition, in order to achieve the foregoing object, according to a fifth aspect of the present invention, there is provided a waveform measuring apparatus having a sampling section (12) for sampling a signal under test having an input arbitrary repetition cycle by means of a sampling signal having a cycle longer than the repetition cycle of the signal under test and a data processing section (23) for obtaining an enveloped waveform of a signal under test sampled by means of the sampling section, and obtaining a signal waveform of the signal under test from the enveloped waveform, the waveform measuring apparatus comprising:

a frequency synthesized signal generator (15) having a reference signal input terminal (REF), the frequency synthesized signal generator outputting a frequency synthesized signal having a frequency obtained by adding or subtracting a frequency of a reference signal to a repetition frequency of the signal under test by employing the reference signal applied to the reference signal input terminal;

a mixer (27) for mixing a frequency synthesized signal output from the frequency synthesized signal generator with the signal under test;

a phase comparator (14) having a reference signal input terminal (REF), the comparator detecting a phase difference between a phase of a reference signal applied to the reference signal input terminal and a phase of an output signal from the mixer, thereby outputting a phase difference signal;

a voltage control oscillator (17) for generating a reference signal phase synchronized with the signal under test based on the phase difference signal output from the phase comparator, and feeding the reference signal back to the reference signal input terminal of the frequency synthesized signal generator and the reference signal input terminal of the phase comparator; and a sampling signal generator circuit (18) for generating the sampling signal by employing a reference signal output from the voltage control oscillator.

In the thus configured waveform measuring apparatus, a sampling signal generated by sampling signal generating means is generated based on a reference signal output from a voltage control oscillator.

In the thus configured waveform measuring apparatus, a mixer is interposed between a frequency synthesized signal generator and a phase comparator.

The mixer signal combines a frequency synthesized signal and a signal under test output from a frequency synthesized signal generator, and delivers these signals to a phase comparator.

A frequency of a frequency synthesized signal generated by a frequency synthesized signal generator is set to a frequency obtained by adding or subtracting a repetition frequency of a signal under test and a frequency of a reference signal with each other, whereby a frequency component of an output signal delivered from the mixer to a phase comparator can be lowered to a frequency component of a reference signal. Thus, there is no need to employ a phase comparator capable of fast processing.

In addition, in order to achieve the foregoing object, according to a sixth aspect of the present invention, there is provided a waveform measuring apparatus according to the fifth aspect, further comprising:

- a frequency measuring section for measuring a repetition frequency of the signal under test; and
- a frequency setting section for setting a frequency of a frequency synthesized signal output from the frequency synthesized signal generator to the frequency synthesized signal generator based on a repetition frequency of the signal under test measured at the frequency measuring section.

In addition, in order to achieve the foregoing object, according to a seventh aspect of the present invention, there is provided a waveform measuring apparatus according to the fifth aspect, further comprising:

- a power divider for power dividing the signal under test that is an optical signal in two ways, if the signal under test is the optical signal; and
- a clock recovery for detecting a clock with its repetition cycle from one of the signal under test divided by the power divider, thereby outputting the signal under test that is the optical signal to be converted into a signal under test of an electrical signal of a sine waveform having the repetition frequency.

In addition, in order to achieve the foregoing object, according to an eighth aspect of the present invention, there is provided a waveform measuring apparatus according to the seventh aspect, further comprising:

- a photo detector for, when the sampling section is an electro-absorption modulator, light receiving a signal under test obtained by sampling a signal under test of the optical signal input from the power divider by means of a sampling signal input from the sampling signal generator circuit, and converting a signal under test that is an optical signal after sampled into a signal under test of an electrical signal;
- an analog/digital converter for converting the signal under test converted into the electrical signal by means of the photo detector into a digital signal under test, and delivering the converted digital signal under test to the data processing section; and
- a display for converting a scale of a time axis of the enveloped waveform obtained by the data processing section into a scale of an original signal under test, and displaying a signal waveform of the signal under test.

In addition, in order to achieve the foregoing object, according to a ninth aspect of the present invention, there is provided a waveform measuring apparatus having a sampling section for sampling a signal under test having an input arbitrary repetition cycle by means of a sampling signal having a cycle longer than the repetition cycle of the signal under test and a data processing section for obtaining an enveloped waveform of a signal under test sampled by means of the sampling section, and obtaining a signal waveform of the signal under test from the enveloped waveform, the waveform measuring apparatus comprising:

- a frequency synthesized signal generator having a reference signal input terminal, the frequency synthesized signal generator outputting a frequency synthesized signal having a frequency equal to 1/n (n: positive integer) of a repetition frequency of the signal under test by employing a reference signal applied to the reference signal input terminal;
- a frequency divider (28) for frequency dividing a repetition frequency of the signal under test to 1/n (n: positive integer), and outputting the signal under test;
- a phase comparator for detecting a phase difference between a phase of the frequency synthesized signal output from the frequency synthesized signal generator and a phase of the signal under test frequency-divided to 1/n (n: positive integer), and outputting a phase difference signal;
- a voltage control oscillator for generating a reference signal phase-synchronized with the signal under test based on the phase difference signal output from the phase comparator, and feeding the reference signal back to the reference signal input terminal of the frequency synthesized signal generator; and
- a sampling signal generator circuit for generating the sampling signal by employing the reference signal output from the voltage control oscillator.

In addition, in order to achieve the foregoing object, according to a tenth aspect of the present invention, there is provided a waveform measuring apparatus according to the ninth aspect, further comprising:

- a power divider for power dividing the signal under test that is an optical signal in two ways, if the signal under test is the optical signal; and
- a clock recovery for detecting a clock with its repetition cycle from one of the signal under test divided by the power divider, thereby outputting the signal under test that is the optical signal to be converted into a signal under test of an electrical signal of a sine waveform having the repetition frequency.

In addition, in order to achieve the foregoing object, according to an eleventh aspect of the present invention, there is provided a waveform measuring apparatus according to the tenth aspect, further comprising:

- a photo detector for, when the sampling section is an electro-absorption modulator, light receiving a signal under test obtained by sampling a signal under test of the optical signal input from the wave divider by means of a sampling signal input from the sampling signal generator circuit, and converting a signal under test that is an optical signal after sampled into a signal under test of an electrical signal;
- an analog/digital converter for converting the signal under test converted into the electrical signal by means of the photo detector into a digital signal under test, and delivering the converted digital signal under test to the data processing section; and
- a display for converting a scale of a time axis of the enveloped waveform obtained by the data processing section into a scale of an original signal under test, and displaying a signal waveform of the signal under test.

In addition, in order to achieve the foregoing object, according to a twelfth aspect of the present invention, there is provided a waveform measuring apparatus having a sampling section for sampling a signal under test having an input arbitrary repetition cycle by means of a sampling signal having a cycle longer than the repetition cycle of the signal under test and a data processing section for obtaining an enveloped waveform of a signal under test sampled by means of the sampling section, and obtaining a signal waveform of the signal under test from the enveloped waveform, the waveform measuring apparatus comprising:

a frequency synthesized signal generator having a reference signal input terminal, the frequency synthesized signal generator outputting a frequency synthesized signal having a frequency obtained by adding or subtracting a frequency equal to a repetition frequency of the signal under test and a frequency that is m times (m: positive integer) of the frequency of the reference signal;

a frequency multiplier (29) for outputting a signal having a frequency that is m times (m: positive integer) of the frequency of the reference signal;

a mixer for mixing the frequency synthesized signal output from the frequency synthesized signal generator with the signal under test;

a phase comparator having a reference signal input terminal, the phase comparator generating a phase difference between a phase of a signal having a frequency that is m times of the frequency of the reference signal applied from the frequency multiplier to the reference input terminal and a phase of an output signal from the mixer, and outputting a phase difference signal;

a voltage control oscillator for generating a reference signal phase-synchronized with the signal under test based on the phase difference signal output from the phase comparator, and feeding the reference signal back to the reference signal input terminal of the frequency synthesized signal generator and the reference signal input terminal of the phase comparator; and a sampling signal generator circuit for generating the sampling signal by employing the reference signal output from the voltage control oscillator.

In addition, in order to achieve the foregoing object, according to a thirteenth aspect of the present invention, there is provided a waveform measuring apparatus according to the twelfth aspect, further comprising:

a power divider for power dividing the signal under test that is an optical signal in two ways, if the signal under test is the optical signal; and a clock recovery for detecting a clock with its repetition cycle from one of the signal under test divided by the wave divider, thereby outputting the signal under test that is the optical signal to be converted into a signal under test of an electrical signal of a sine waveform having the repetition frequency.

In addition, in order to achieve the foregoing object, according to a thirteenth aspect of the present invention, there is provided a waveform measuring apparatus according to the twelfth aspect, further comprising:

a power divider for, when the signal under test is an optical signal, power dividing the signal under test that is the optical signal into two ways; and a clock recovery for detecting a clock of the repetition cycle from such one signal under test divided by the power divider, thereby converting the signal under test that is the optical signal into a signal under test of an electrical signal with a sine waveform having the repetition frequency, and outputting the converted signal.

In addition, in order to achieve the foregoing object, according to a fourteenth aspect of the present invention, there is provided a waveform measuring apparatus according to the thirteenth aspect, further comprising:

a photo detector for, when the sampling section is an electro-absorption modulator, light receiving a signal under test obtained by sampling a signal under test of the optical signal input from the power divider by means of a sampling signal input from the sampling signal generator circuit, and converting a signal under test that is an optical signal after sampled into a signal under test of an electrical signal;

an analog/digital converter for converting the signal under test converted into the electrical signal by means of the photo detector into a digital signal under test, and delivering the converted digital signal under test to the data processing section; and a display for converting a scale of a time axis of the enveloped waveform obtained by the data processing section into a scale of an original signal under test, and displaying a signal waveform of the signal under test.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently embodiments of the invention, and together with the general description given above and the detailed description of the embodiments given below, serve to explain the principles of the invention.

FIG 1 is a block diagram depicting a schematic configuration of a waveform measuring apparatus according to a first embodiment of the present invention;

FIG. 3 is a block diagram depicting a schematic configuration of a waveform measuring apparatus according to a third embodiment of the present invention;

FIG. 4 is a block diagram depicting a schematic configuration of a waveform measuring apparatus according to a fourth embodiment of the present invention;

FIGS. 7A, 7B, and 7C are views each illustrating a principle in which a signal waveform of a conventional typical signal under test is obtained by employing a sampling technique;

FIG. 8 is a block diagram depicting a schematic configuration of a conventional waveform measuring apparatus; and FIG. 9 is a block diagram depicting a schematic configuration of another conventional waveform measuring apparatus.

DETAILED DESCRIPTION OF THE INVENTION

Figure 2:
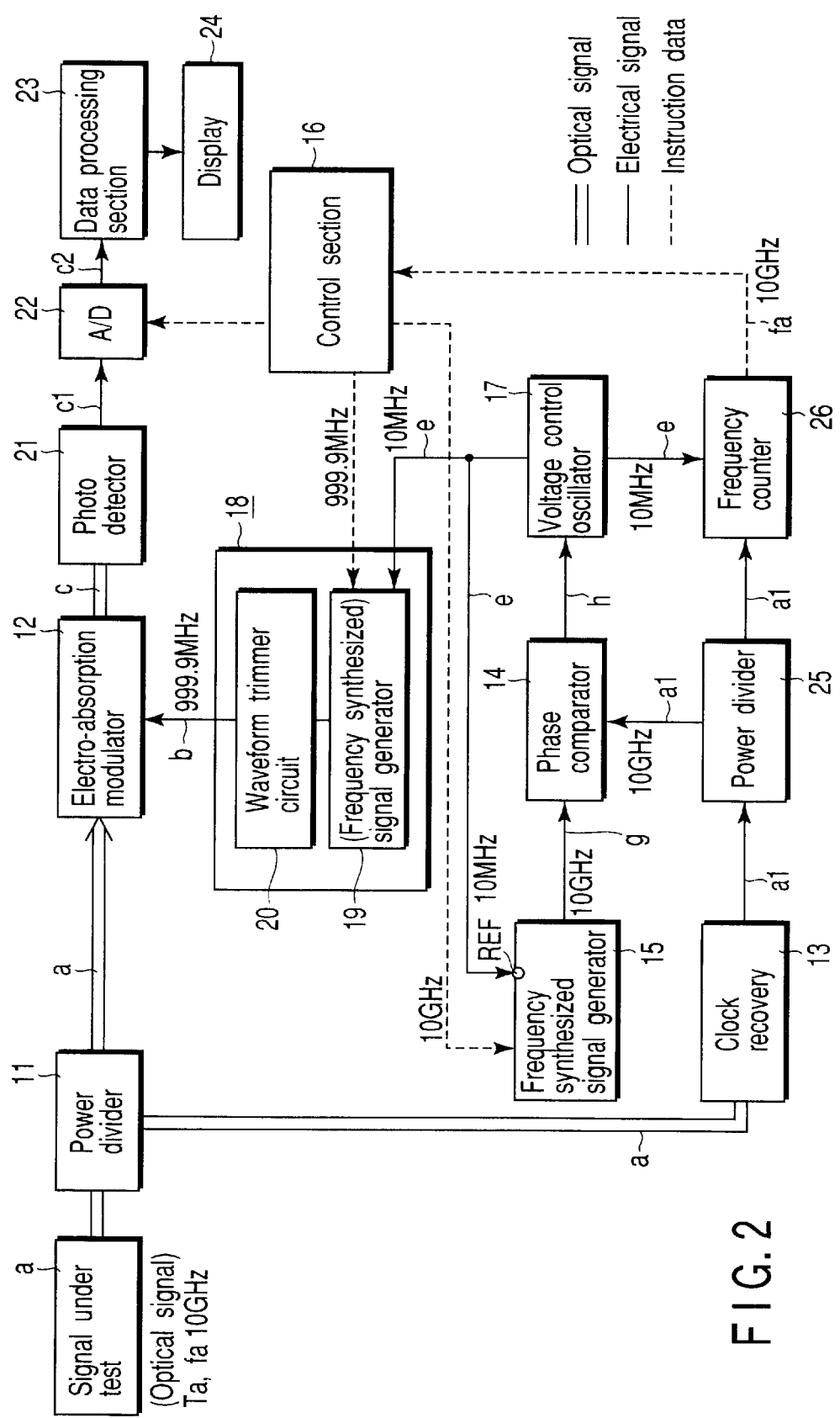
FIG. 2 is a block diagram depicting a schematic configuration of a waveform measuring apparatus according to a second embodiment of the present invention.

Reference will now be made in detail to the presently preferred embodiments of the invention as illustrated in the accompanying drawing, in which like reference numerals designate like or corresponding parts.

Hereinafter, preferred embodiments of the present invention will be described with reference to the accompanying drawings.

(First Embodiment)

FIG. 1 is a block diagram depicting a schematic configuration of a waveform measuring apparatus according to a first embodiment of the present invention.

First, a signal under test "a" input from an input terminal (not shown), the signal under test such as an optical signal that has a repetition cycle Ta (repetition frequency "fa") shown in FIG. 7A, is guided to a frequency divider 11.

The signal under test "a" guided to this frequency divider 11 is frequency divided into two ways, one of which is incident to an electro-absorption modulator 12 that is a sampling section, and the other of which is incident to a clock recovery 13.

In the waveform measuring apparatus according to the present embodiment, the repetition frequency "fa" of the signal inter test "a" is assumed to be set to 10 GHz.

The clock recovery 13 detects a clock of a repetition cycle Ta in the signal under test "a" such as an incident optical signal. Then, this clock recovery 13 converts the incident signal under test "a" such as an optical signal into a signal under test "a1" of the electrical signal with a sine waveform having the frequency "fa" (repetition frequency), and delivers the converted signal to one input terminal of a next phase comparator 14.

A frequency synthesized signal generator 15 is formed of a frequency synthesizer or the like, for example. A reference signal "e" applied to the reference signal input terminal REF is multiplied or frequency divided, thereby making it possible to generate a frequency synthesized signal "g" having an arbitrary frequency.

Specifically, this frequency synthesized signal generator 15 generates and outputs the frequency synthesized signal "g" having the frequency "fa" of 10 GHz that is a repetition frequency of the signal under test "a" instructed from a control section 16 that includes a microcomputer (CPU), for example, by employing a reference signal "e" of 10 MHz applied from a voltage control oscillator (VCO) 17 to the reference signal input terminal REF.

In this case, the frequency synthesized signal generator 15 multiplies the frequency of the reference signal "e" to 1,000 times.

Of course, a phase of the frequency synthesized signal "g" output from the frequency synthesized signal generator 15 is completely. synchronized with a phase of the reference signal "e" one by one.

The frequency synthesized signal "g" having the frequency "fa" output from the frequency synthesized signal generator 15 is applied to the other input terminal of a phase comparator 14.

This phase comparator 14 detects a phase difference between a phase of a signal under test "a1" having a frequency "fa" converted into an electrical signal from a clock recovery 13 applied to one input terminal and a phase of the frequency synthesized signal "g" having a frequency "fa" from the frequency synthesized signal generator 15 applied to the other input terminal, and delivers a phase difference signal "h" to a voltage control oscillator (VCO) 17.

This voltage control oscillator (VCO) 17 generates the previously described reference signal "e" of 10 MHz, and feeds the generated signal back to a reference signal input terminal REF of the frequency synthesized signal generator 15.

The phase comparator 14, voltage control oscillator (VCO) 17, and frequency synthesized signal generator 15 each configures a PLL circuit. Thus, a phase of the reference signal output from the voltage control oscillator (VCO) 17 is always synchronized with a phase of the signal under test "a1".

In addition, the reference signal "e" output from the voltage control oscillator (VCO) 17 is fed back to the frequency synthesized signal generator 15, and is input to a sampling signal generator circuit 18 for generating a sampling signal "b".

This sampling signal generator circuit 18 is composed of a signal generator 19 such as a frequency synthesized generator and a waveform trimmer circuit 20.

Here, the signal generator 19 is formed of a frequency synthesizer or the like, for example, like the previously described frequency synthesized signal generator 15. The reference signal "e" applied to the reference signal input terminal is multiplied or frequency divided, thereby making it possible to generate a signal having an arbitrarily frequency.

Specifically, this signal generator 19 generates and outputs a signal having a frequency of 999.9 MHz that is a frequency "fb" of a sampling signal "b" instructed from the control section 16 by employing the reference signal "e" of 10 MHz applied from the voltage control oscillator (VCO) 17.

Here, when a relationship between the frequency "fb" of the sampling "b" and the repetition frequency "fa" of the signal under test "a" is verified, if fa=10 GHz, fb=999.9 MHz are substituted into formula (1) described previously, the result is obtained as 999.9 MHz=(10 GHz/n)−Δf. Therefore, formula (1) is established when n=10, and Δf=0.1 MHz, for example.

A signal having a sine waveform output from such signal generator 19 is waveform trimmed by means of a next waveform trimming circuit 20 into a pulse wave shaped sampling signal "b" having a repetition frequency "fb" (repetition cycle Tb) as shown in FIG. 7B.

The sampling signal "b" having the frequency "fb" output from such sampling signal generator 18 is input to an electro-absorption modulator 12.

This electro-absorption modulator 12, as described previously, samples the signal under test "a" of an optical signal input from a power divider 11 by means of the sampling signal "b" input from a sampling signal generator circuit 18, and delivers a signal under test "c" of a sampled optical signal to a photo detector 21.

This photo detector 21 converts the signal under test "c" of the incident optical signal after sampled into a signal under test "c1" of an electrical signal.

Then, the signal under test "c1" output from the photo detector 21 is converted into the sampled digital signal under test "c2" by means of an analog/digital (A/D) converter 22, and the converted signal is input to a data processing section 23.

This data processing section 23 calculates an enveloped waveform of the input, sampled signal under test "c2", converts a scale of a time axis of this enveloped waveform into a scale of the original signal under test "a". Then, a signal waveform "d" of the signal under test "a" is output to and displayed on a display 24.

In the thus configured waveform measuring apparatus according to the first embodiment, an operator of this waveform measuring apparatus can set a repetition frequency "fb" of a sampling signal "b" relevant to a signal generator 19 of a sampling signal generator 1 via a control section 16 completely independent of the repetition frequency "fa" of the signal under test "a".

In this case, a phase of the reference signal "e" applied to the signal generator 19 of the sampling signal generator circuit 18 is always completely coincident with a phase of the signal under test "a" by means of a phase control function of a PLL circuit composed of a phase comparator 14, a voltage control oscillator (VCO) 17, and a frequency synthesized signal generator 15.

Therefore, in such waveform measuring apparatus, the frequency "fb" of the sampling signal "b" for sampling a signal under test can be arbitrarily set independent of the repetition frequency "fa" of the signal under test "a". In addition, the sampling signal "b" is always phase synchronized with the signal under test "a", and thus, a quantity of generated jitter is restrained.

Hence, according to such waveform measuring apparatus according to the first embodiment, the measurement precision of the signal waveform "d" of the signal under test "a" can be improved while a quantity of generated jitter is remarkably restricted, and the signal waveform "d" can be measured with arbitrary resolution precision.

(Second Embodiment)

FIG. 2 is a block diagram depicting a schematic configuration of a waveform measuring apparatus according to a second embodiment of the present invention.

In FIG. 2, like elements of the waveform measuring apparatus according to the first embodiment shown in FIG. 1 are designated by like reference numerals. A duplicate detailed description is omitted here.

In the waveform measuring apparatus according to the second embodiment, a signal under test "a1" of an electrical signal output from a clock recovery 13 is guided to a wave divider 25.

The signal under test "a1" guided to this wave divider 25 is wave divided into two fragments, one of which is input to a phase comparator 14, and the other of which is input to a frequency counter 26.

This frequency counter 26 measures a repetition frequency "fa" of the signal under test "a1" of the input electrical signal, and delivers data on the measured repetition frequency "fa" to the control section 16.

To the frequency counter 26, a reference signal "e" is input from a voltage control oscillator 17 in order to synchronize a timing of a clock (waveform) of the signal under test "a1" with a timing of a clock count.

The control section 16 sets a repetition frequency "fa" of a signal under test "a" input from the frequency counter 26 relevant to a frequency synthesized signal generator 15 as a frequency of a frequency synthesized signal "g" output from the frequency synthesized signal generator 15.

Therefore, the frequency synthesized signal generator 15 delivers the frequency synthesized signal having the frequency "fa" identical to the repetition frequency of the signal under test "a", like the frequency synthesized signal generator 15 in the waveform measuring apparatus according to the first embodiment shown in FIG. 1.

The subsequent operation is identical to an operation of the waveform measuring apparatus according to the first embodiment shown in FIG. 1.

In the thus configured waveform measuring apparatus according to the second embodiment, the repetition frequency "fa" of the signal under test "a" is measured by means of a frequency counter 26, and the measured frequency is set at the frequency synthesized signal generator 15. Thus, like the previously described waveform measuring apparatus according to the first embodiment, the signal waveform "d" of the signal under test "a" can be measured with arbitrary resolution precision while a quantity of generated jitter is restrained.

Further, in the waveform measuring apparatus according to the second embodiment, even if the repetition frequency "fa" of the signal under test "a" is unknown, the signal waveform "d" of the signal under test "a" can be correctly measured.

(Third Embodiment)

FIG. 3 is a block diagram depicting a schematic configuration of a waveform measuring apparatus according to a third embodiment of the present invention.

In FIG. 3, like elements of the waveform measuring apparatus according to the first embodiment shown in FIG. 1 are designated by like reference numerals. A duplicate detailed description is omitted here.

In the waveform measuring apparatus according to the third embodiment, a mixer 27 is interposed between a frequency synthesized signal generator 15 and one input terminal of a phase comparator 14.

A signal under test "a1" of an electrical signal output from a clock recovery 13 is input to the mixer 27 without being input to the phase comparator 14.

A voltage control oscillator (VCO) 17 applies a reference signal "e" having a frequency of 10 MHz to a reference signal input terminal REF of the frequency synthesized signal generator 15, and applies the reference signal to the other input terminal (reference signal input terminal REF) of the phase comparator 14.

Further, to the frequency synthesized signal generator 15, a frequency obtained by adding a frequency of the reference signal to a repetition frequency "fa" of a signal under test "a" is input as a set frequency from the control section 16.

In the thus configured waveform measuring apparatus according to the third embodiment, the frequency synthesized signal generator 15 outputs a frequency synthesized signal "g" having a frequency obtained by adding a frequency of a reference signal to the frequency "fa" of the signal under test "a".

In the waveform measuring apparatus according to the present embodiment, the repetition frequency "fa" of the signal under test "a" is set to 10 GHz, and the frequency of a reference signal "e" is set to 10 MHz. Thus, from the frequency synthesized signal generator 15, the frequency synthesized signal "g" having a frequency of 10 GHz+19 MHz is delivered to the next mixer 27.

This mixer 27 mixes the frequency synthesized signal "g" output from the frequency synthesized signal generator 15 with the signal under test "a1" output from a clock recovery 13.

Therefore, an output signal "j" from this mixer 27 includes a phase difference component between the signal under test "a1" and the reference signal "e" in the frequency synthesized signal "g".

Namely, the output signal "j" from the mixer 27 has a component of a frequency (10 MHz) in difference between the frequency (10 GHz+10 MHz) of the frequency synthesized signal "g" and a frequency (10 GHz) of the signal under test "a1".

The output signal "j" from such mixer 27 is delivered to one input terminal of a phase comparator 14.

This phase comparator 14 detects a phase difference between a phase of the output signal "j" of the mixer 27 and a phase of the reference signal "e", and applies a phase difference signal "h" to a voltage control oscillator (VCO) 17.

This voltage control oscillator (VCO) 17 generates the previously described reference signal "e" of 10 MHz, and feeds the generated signal to a reference signal input terminal REF of the frequency synthesized signal generator 15 and a reference signal input terminal REF of the phase comparator 14.

Here, the mixer 27, phase comparator 14, and voltage control oscillator (VCO) 17 each configures a PLL circuit. Thus, a phase of the reference signal "e" output from the voltage control oscillator (VCO) 17 is always synchronized with a phase of the signal under test "a1".

The reference signal "e" of 10 MHz output from such voltage control oscillator (VCO) 17 is fed back to the reference signal input terminal REF of each of the frequency synthesized signal generator 15 and phase comparator 14, and is input to a sampling signal generator circuit 18.

This sampling signal generator circuit 18 generates a sampling signal "b" shown in FIG. 7B, and applies the signal to an electro-absorption modulator 12.

The subsequent operation is identical to an operation of the waveform measuring apparatus according to the first embodiment shown in FIG. 1.

Therefore, in the waveform measuring apparatus according to the third embodiment as well, the signal waveform "d" of the input signal under test "a" can be measured.

Further, in the waveform measuring apparatus according to the third embodiment, the mixer 27 is interposed between the frequency synthesized signal generator 15 and the phase comparator 14, whereby a frequency component of the output signal "jj" from the mixer 27 input to the phase comparator 14 can be lowered to a frequency component of the reference signal "e". Thus, there is no need to employ a phase comparator capable of fast processing as the phase comparator 14.

Therefore, the cost of the entire waveform measuring apparatus can be reduced, and the measurement precision of the signal waveform "d" to be measured can be improved.

(Fourth Embodiment)

FIG. 4 is a block diagram depicting a schematic configuration of a waveform measuring apparatus according to a fourth embodiment of the present invention.

In FIG. 4, like elements of the waveform measuring apparatus according to the second or third embodiment as shown in FIG. 2 or FIG. 3 are designated by like reference numerals. A duplicate detailed description is omitted here.

In the waveform measuring apparatus according to the fourth embodiment, a power divider 25 and a frequency counter 26 in the waveform measuring apparatus according to the second embodiment shown in FIG. 2 are added to the waveform measuring apparatus according to the third embodiment shown in FIG. 3.

In this case, a signal under test "a1" output from a clock recovery 13 is guided to a wave divider 25.

The signal under test "a1" guided to this power divider 25 is divided into two fragments, one of which is input to a mixer 27, and the other of which is input to the frequency counter 26.

This frequency counter 26 measures a repetition frequency "fa" of a signal under test "a1" of an input electrical signal, and delivers data on the measured repetition frequency "fa" to the control section 16.

The control section 16 sets a frequency obtained by adding a frequency of a reference signal "e" to the repetition frequency "fa" of the signal under test "a" input from the frequency counter 26, relevant to the frequency synthesized signal generator 15.

Therefore, the frequency synthesized signal generator 15 outputs a frequency synthesized signal "g" having a frequency obtained by adding the frequency of the reference signal to the repetition frequency "fa" of the signal under test "a", like the frequency synthesized signal generator in the waveform measuring apparatus according to the third embodiment shown in FIG. 3.

Hence, in the waveform measuring apparatus according to the fourth embodiment, like the waveform measuring apparatus according to the third embodiment described previously, the signal waveform "d" of the input signal under test "a" can be correctly measured.

Further, in the waveform measuring apparatus according to the fourth embodiment, even if the repetition frequency "fa" of the signal under test "a" is unknown, the signal waveform "d" of the signal under test "a" can be correctly measured.

(Fifth Embodiment)

Figure 5:
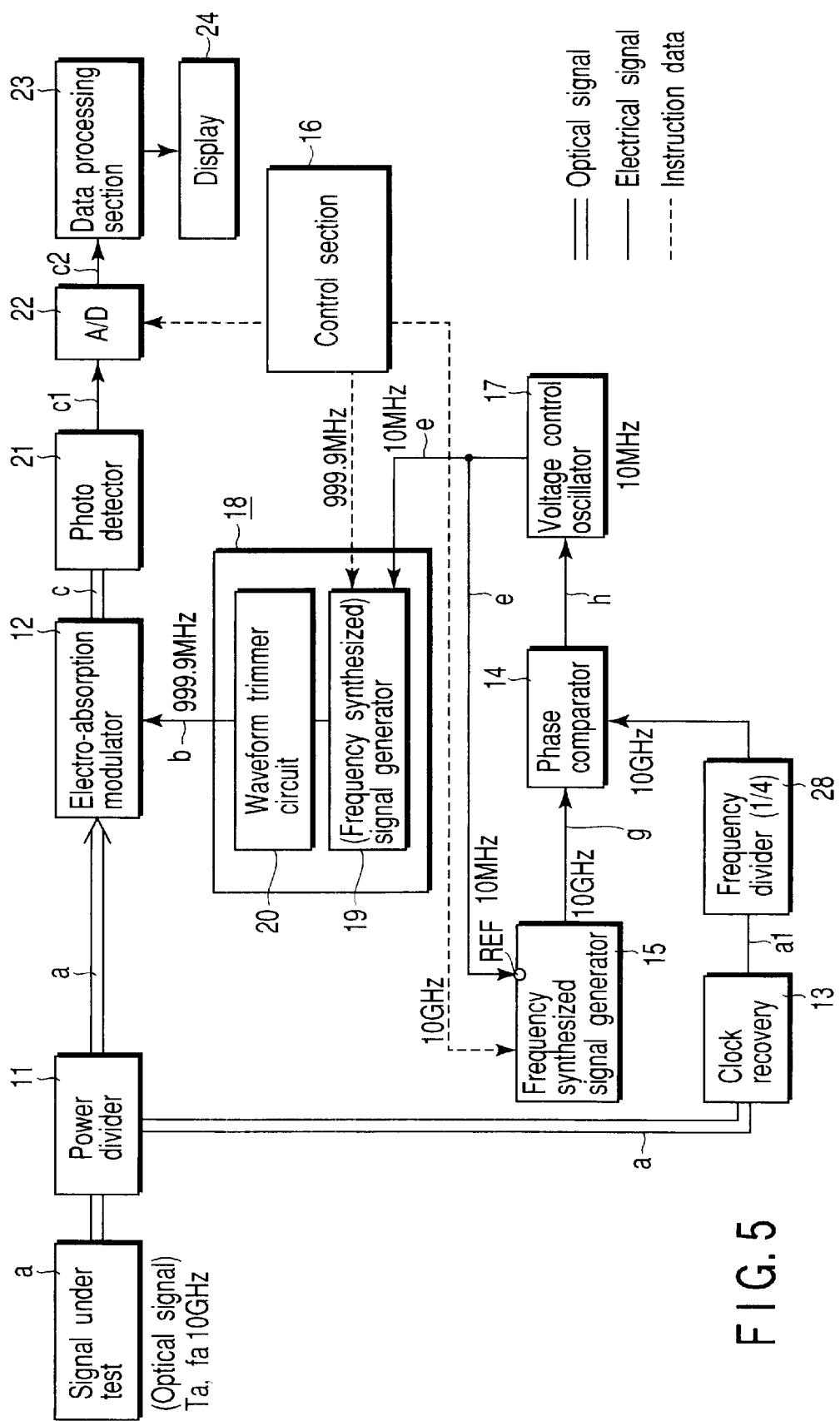
FIG. 5 is a block diagram depicting a schematic configuration of a waveform measuring apparatus according to a fifth embodiment of the present invention.

FIG. 5 is a block diagram depicting a schematic configuration of a waveform measuring apparatus according to a fifth embodiment of the present invention.

In FIG. 5, like elements of the waveform measuring apparatus according to the first embodiment shown in FIG. 1 are designated by like reference numerals. A duplicate detailed description is omitted here.

In the waveform measuring apparatus according to the present embodiment, a frequency divider 28 is interposed between a clock recovery 13 and a phase comparator 14.

This frequency divider 28 has a function for causing an electrical signal "a1" having a frequency "fa" output from the clock recovery 13 to coincide with a frequency of a frequency synthesized signal "g" output from a frequency synthesized signal generator 15.

In this way, the frequency divider 28 is provided between the clock recovery 13 and the phase comparator 14, whereby there is no need to cause a frequency of the frequency synthesized signal "g" output from the frequency synthesized signal generator 15 to always coincide with a frequency "fa" of the signal under test "a".

In the waveform measurement apparatus according to the present embodiment shown in FIG. 5, the frequency "fa" of the signal under test "a" is set to 40 GHz, and a frequency of the frequency synthesized signal "g" of the frequency synthesized signal generator 15 is set to 10 GHz that is ¼ of the frequency "fa" of the signal under test "a". Thus, the frequency dividing ratio of the frequency divider 28 is assumed to be set to 4 (that is, n=4).

(Sixth Embodiment)

Figure 6:
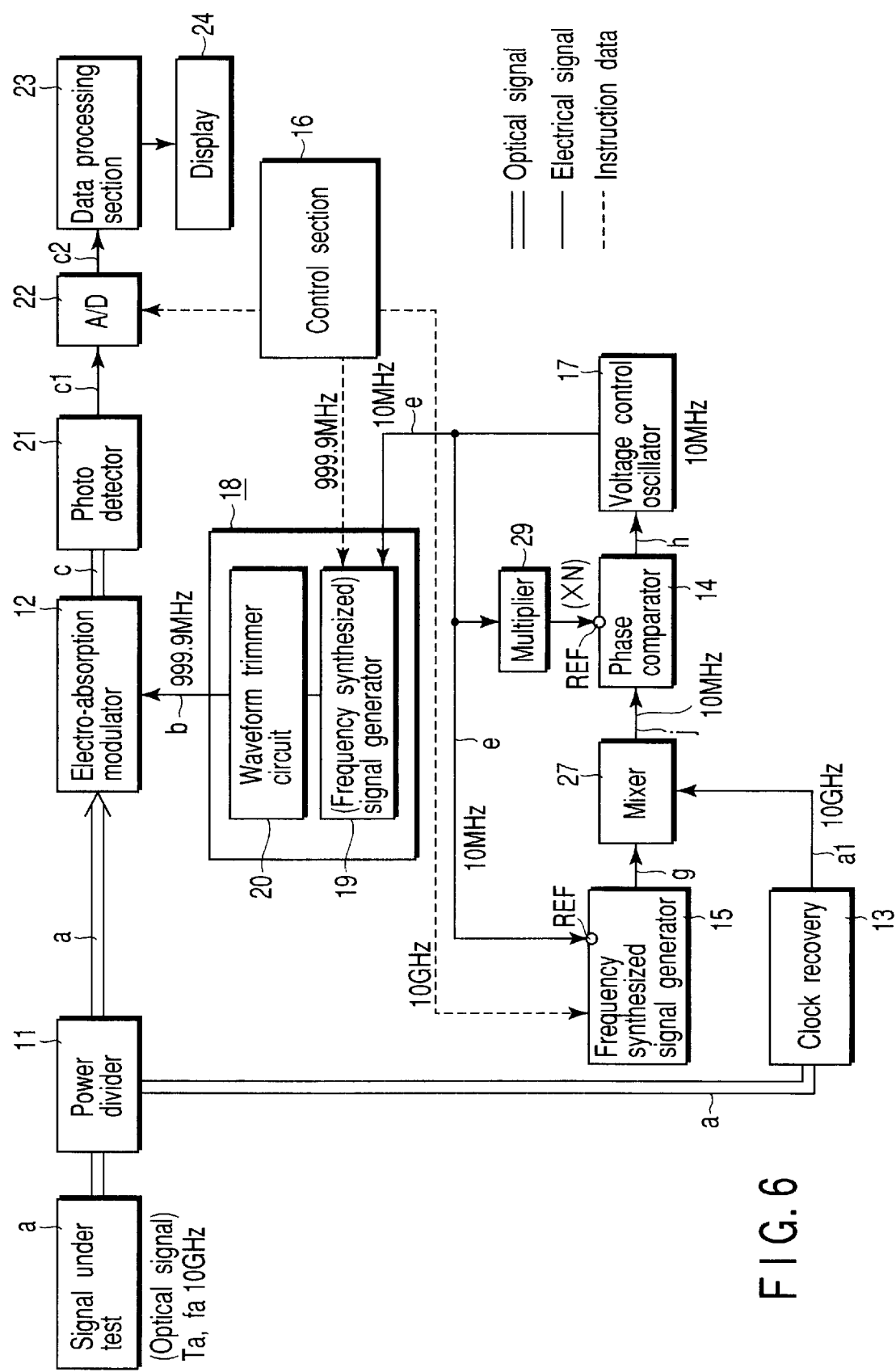
FIG. 6 is a block diagram depicting a schematic configuration of a waveform measuring apparatus according to a sixth embodiment of the present invention.

FIG. 6 is a block diagram depicting a schematic configuration of a waveform measuring apparatus according to a sixth embodiment of the present invention.

In FIG. 6, like elements of the waveform measuring apparatus according to a third embodiment shown in FIG. 3 are designates by like reference numerals. A duplicate detailed description is omitted here.

In the waveform measuring apparatus according to the present embodiment, a frequency multiplier 29 is interposed between a voltage control oscillator 17 and a phase comparator 14.

This frequency multiplier 29 has a function for multiplying a frequency of a reference signal "e" of 10 Hz output from a voltage control oscillator 17, thereby causing the frequency of the reference signal "e" applied to a reference signal input terminal REF of a phase comparator 14 to coincide with a frequency of an output signal "j" output from a mixer 27 to the phase comparator 14.

Therefore, a frequency to be set from a control section 16 to a frequency synthesized signal generator 15 is 10 GHz+ (N×10) MHz instead of 10 GHz+10 MHz, and the degree of freedom for setting increases.

The configuration according to the present invention is not limited to only the configuration of each of the present embodiments.

For example, in the waveform measuring apparatus according to each of the present embodiments, although the signal under test "a" is assumed to be an optical signal, this signal under test "a" may be a general electrical signal.

In this case, an electrical input signal to the electro-absorption modulator 12 is defined as a signal under test, and an optical input signal is defined as a sampling signal, thereby making it possible to ensure sampling of an electrical signal.

At this time, a sampling signal generator circuit 18 serves as a signal generator circuit for outputting an optical signal employing a short pulse light source or the like.

In addition, instead of the electro-absorption modulator 12, a sampling circuit 1 applied to a general electrical signal shown in FIGS. 8 and 9 can be employed.

Further, in the waveform measuring apparatus according to the third and sixth embodiments, although the frequency synthesized signal generator 15 outputs a frequency synthesized signal "g" having a frequency of a reference signal or having a frequency obtained by adding the frequency of the reference signal multiplied to N times (m=N) to a repetition frequency "fa" of a signal under test "a", a frequency synthesized signal "g" having a frequency of a reference signal or a frequency obtained by subtracting the frequency of the reference signal multiplied to N times (m=N) from the repetition frequency "fa" of the signal under test "a" may be output without limited thereto.

As has been described above, in the waveform measuring apparatus, a frequency synthesized signal for acquiring a repetition frequency of a sampling signal is generated by employing a frequency synthesized signal generator, and the thus generated frequency synthesized signal is always phase synchronized with a signal under test by employing a PLL technique.

Therefore, according to the waveform measuring apparatus of the present invention, a frequency of a sampling signal for sampling a signal under test can be arbitrarily set, the measurement precision of a signal waveform of the signal under test can be improved while a quantity of generated jitter is remarkably restrained, and a signal waveform can be measured with arbitrary resolution precision.

Therefore, according to the present invention, there can be provided a waveform measuring apparatus in which a frequency synthesized signal for acquiring a repetition frequency of a sampling signal is generated by employing a frequency synthesized signal generator, and the thus generated frequency synthesized signal is always phase synchronized with a signal under test by employing a PLL technique, whereby a frequency of a sampling signal for sampling a signal under test can be arbitrarily set, the measurement precision of a signal waveform of the signal under test can be improved while a quantity of generated jitter is remarkably restrained, and a signal waveform can be measured with arbitrary resolution precision.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A waveform measuring apparatus comprising:

a sampling section which samples a signal under test having an input predetermined repetition cycle by means of a sampling signal having a cycle longer than the repetition cycle of the signal under test;

a data processing section which obtains an enveloped waveform of the signal under test sampled by means of the sampling section, and which produces a signal waveform of the signal under test from the enveloped waveform;

a frequency synthesized signal generator which has a reference signal input terminal, and which outputs a frequency synthesized signal having a frequency equal to a repetition frequency of the signal under test;

a phase comparator which detects a phase difference between a phase of the frequency synthesized signal output from the frequency synthesized signal generator and a phase of the signal under test, and which then outputs a phase difference signal;

a voltage control oscillator which generates a reference signal that is phase synchronized with the signal under test based on the phase difference signal output from the phase comparator, and which then feeds the reference signal back to the reference signal input terminal of the frequency synthesized signal generator; and a sampling signal generator circuit which generates the sampling signal by employing the reference signal output from the voltage control oscillator.

2. A waveform measuring apparatus comprising:

a sampling section which samples a signal under test having an input arbitrary repetition cycle by means of a sampling signal having a cycle longer than the repetition cycle of the signal under test;

a data processing section which obtains an enveloped waveform of the signal under test sampled by means of the sampling section, and which produces a signal waveform of the signal under test from the enveloped waveform;

a frequency synthesized signal generator which has a reference signal input terminal, and which outputs a frequency synthesized signal having a frequency equal to a repetition frequency of the signal under test;

a phase comparator which detects a phase difference between a phase of the frequency synthesized signal output from the frequency synthesized signal generator and a phase of the signal under test, and which then outputs a phase difference signal;

a voltage control oscillator which generates a reference signal that is phase synchronized with the signal under test based on the phase difference signal output from the phase comparator, and which then feeds the reference signal back to the reference signal input terminal of the frequency synthesized signal generator;

a sampling signal generator circuit which generates the sampling signal by employing the reference signal output from the voltage control oscillator;

a frequency measuring section which measures the repetition frequency of the signal under test based on the reference signal output from the voltage control oscillator; and a frequency setting section which sets the frequency of the frequency synthesized signal output from the frequency synthesized signal generator based on the repetition frequency of the signal under test measured by the frequency measuring section.

3. A waveform measuring apparatus according to claim 1, further comprising:

a power divider which power divides the signal under test into two optical signals when the signal under test is an optical signal; and a clock recovery which detects a clock and a repetition cycle of the clock from one of the two optical signals divided by the power divider, and which converts said one of the two optical signals into an electrical signal of a sine waveform having the repetition frequency of the signal under test.

4. A waveform measuring apparatus according to claim 3, further comprising:

a photo detector which, when the sampling section is an electro-absorption modulator, light receives the signal under test obtained by sampling one of the two optical signals divided by the power divider by means of the sampling signal generated by the sampling signal generator circuit, and which converts the sampled one of the two optical signals into an electrical signal;

an analog/digital converter which converts the electrical signal into a digital signal under test, and which delivers the converted digital signal under test to the data processing section; and a display which converts a scale of a time axis of the enveloped waveform obtained by the data processing section into an original scale of the signal under test, and which displays the signal waveform of the signal under test.

5. A waveform measuring apparatus according to claim 2, further comprising:

a power divider which power divides the signal under test into two optical signals when the signal under test is an optical signal; and a clock recovery which detects a clock and a repetition cycle of the clock from one of the two optical signals divided by the power divider, and which converts said one of the two optical signals into an electrical signal of a sine waveform having the repetition frequency of the signal under test.

6. A waveform measuring apparatus according to claim 5, further comprising:

a photo detector which, when the sampling section is an electro-absorption modulator, light receives the signal under test obtained by sampling one of the two optical signals divided by the power divider by means of the sampling signal generated by the sampling signal generator circuit, and which converts the sampled one of the two optical signals into an electrical signal;

an analog/digital converter which converts the electrical signal into a digital signal under test, and which delivers the converted digital signal under test to the data processing section; and a display which converts a scale of a time axis of the enveloped waveform obtained by the data processing section into an original scale of the signal under test, and which displays the signal waveform of the signal under test.

7. A waveform measuring apparatus comprising:

a sampling section which samples a signal under test having an input predetermined repetition cycle by means of a sampling signal having a cycle longer than the repetition cycle of the signal under test;

a data processing section which obtains an enveloped waveform of the signal under test sampled by means of the sampling section, and which produces a signal waveform of the signal under test from the enveloped waveform;

a frequency synthesized signal generator which has a reference signal input terminal to which a reference signal is input, and which outputs a frequency synthesized signal having a frequency obtained by adding or subtracting a frequency of the reference signal to a repetition frequency of the signal under test;

a mixer which mixes the frequency synthesized signal output from the frequency synthesized signal generator with the signal under test;

a phase comparator which also has a reference signal input terminal to which the reference signal is input, and which detects a phase difference between a phase of the reference signal and a phase of an output signal from the mixer, and which then outputs a phase difference signal;

a voltage control oscillator which generates the reference signal so as to be phase synchronized with the signal under test based on the phase difference signal output from the phase comparator, and which feeds the reference signal back to the reference signal input terminal of the frequency synthesized signal generator and the reference signal input terminal of the phase comparator; and a sampling signal generator circuit which generates the sampling signal by employing the reference signal output from the voltage control oscillator.

8. A waveform measuring apparatus according to claim 5, further comprising:

a power divider which power divides the signal under test into two optical signals when the signal under test is an optical signal; and a clock recovery which detects a clock and a repetition cycle of the clock from one of the two optical signals divided by the power divider, and which converts said one of the two optical signals into an electrical signal of a sine waveform having the repetition frequency of the signal under test.

9. A waveform measuring apparatus according to claim 8, further comprising:

a photo detector which, when the sampling section is an electro-absorption modulator, light receives the signal under test obtained by sampling one of the two optical signals divided by the power divider by means of the sampling signal generated by the sampling signal generator circuit, and which converts the sampled one of the two optical signals into an electrical signal;

an analog/digital converter which converts the electrical signal into a digital signal under test, and which delivers the converted digital signal under test to the data processing section; and a display which converts a scale of a time axis of the enveloped waveform obtained by the data processing section into an original scale of the signal under test, and which displays the signal waveform of the signal under test.

10. A waveform measuring apparatus comprising:

a sampling section which samples a signal under test having an input arbitrary repetition cycle by means of a sampling signal having a cycle longer than the repetition cycle of the signal under test;

a data processing section which obtains an enveloped waveform of the signal under test sampled by means of the sampling section, and which produces a signal waveform of the signal under test from the enveloped waveform;

a frequency synthesized signal generator which has a reference signal input terminal to which a reference signal is input, and which outputs a frequency synthesized signal having a frequency obtained by adding or subtracting a frequency of the reference signal to a repetition frequency of the signal under test;

a mixer which mixes the frequency synthesized signal output from the frequency synthesized signal generator with the signal under test;

a phase comparator which also has a reference signal input terminal to which the reference signal is input, and which detects a phase difference between a phase of the reference signal and a phase of an output signal from the mixer, and which then outputs a phase difference signal;

a voltage control oscillator which generates the reference signal so as to be phase synchronized with the signal under test based on the phase difference signal output from the phase comparator, and which feeds the reference signal back to the reference signal input terminal of the frequency synthesized signal generator and the reference signal input terminal of the phase comparator;

a sampling signal generator circuit which generates the sampling signal by employing the reference signal output from the voltage control oscillator;

a frequency measuring section which measures the repetition frequency of the signal under test; and a frequency setting section which sets the frequency of the frequency synthesized signal output from the frequency synthesized signal generator based on the repetition frequency of the signal under test measured by the frequency measuring section.

11. A waveform measuring apparatus according to claim 10, further comprising:

a power divider which power divides the signal under test into two optical signals when the signal under test is an optical signal; and a clock recovery which detects a clock and a repetition cycle of the clock from one of the two optical signals divided by the power divider, and which converts said one of the two optical signals into an electrical signal of a sine waveform having the repetition frequency of the signal under test.

12. A waveform measuring apparatus according to claim 11, further comprising:

a photo detector which, when the sampling section is an electro-absorption modulator, light receives the signal under test obtained by sampling one of the two optical signals divided by the power divider by means of the sampling signal generated by the sampling signal generator circuit, and which converts the sampled one of the two optical signals into an electrical signal;

an analog/digital converter which converts the electrical signal into a digital signal under test, and which delivers the converted digital signal under test to the data processing section; and a display which converts a scale of a time axis of the enveloped waveform obtained by the data processing section into an original scale of the signal under test, and which displays the signal waveform of the signal under test.

13. A waveform measuring apparatus comprising:

a sampling section which samples a signal under test having an input predetermined repetition cycle by means of a sampling signal having a cycle longer than the repetition cycle of the signal under test;

a data processing section which obtains an enveloped waveform of the signal under test sampled by means of the sampling section, and which produces a signal waveform of the signal under test from the enveloped waveform;

a frequency synthesized signal generator which has a reference signal input terminal, and which outputs a frequency synthesized signal having a frequency equal to 1/n (n: positive integer) of a repetition frequency of the signal under test;

a frequency divider which frequency divides the repetition frequency of the signal under test to 1/n (n: positive integer), and which then outputs the signal under test;

a phase comparator for detecting a phase difference between a phase of the frequency synthesized signal output from the frequency synthesized signal generator and a phase of the signal under test frequency-divided to 1/n (n: positive integer), and which then outputs a phase difference signal;

a voltage control oscillator which generates a reference signal that is phase-synchronized with the signal under test based on the phase difference signal output from the phase comparator, and which then feeds the reference signal back to the reference signal input terminal of the frequency synthesized signal generator; and a sampling signal generator circuit which generates the sampling signal by employing the reference signal output from the voltage control oscillator.

14. A waveform measuring apparatus according to claim 13, further comprising:

a power divider which power divides the signal under test into two optical signals when the signal under test is an optical signal; and a clock recovery which detects a clock and a repetition cycle of the clock from one of the two optical signals divided by the power divider, and which converts said one of the two optical signals into an electrical signal of a sine waveform having the repetition frequency of the signal under test.

15. A waveform measuring apparatus according to claim 14, further comprising:

a photo detector which, when the sampling section is an electro-absorption modulator, light receives the signal under test obtained by sampling one of the two optical signals divided by the power divider by means of the sampling signal generated by the sampling signal generator circuit, and which converts the sampled one of the two optical signals into an electrical signal;

an analog/digital converter which converts the electrical signal into a digital signal under test, and which delivers the converted digital signal under test to the data processing section; and a display which converts a scale of a time axis of the enveloped waveform obtained by the data processing section into an original scale of the signal under test, and which displays the signal waveform of the signal under test.

16. A waveform measuring apparatus comprising:
- a sampling section which samples a signal under test having an input predetermined repetition cycle by means of a sampling signal having a cycle longer than the repetition cycle of the signal under test;
- a data processing section which obtains an enveloped waveform of the signal under test sampled by means of the sampling section, and which produces a signal waveform of the signal under test from the enveloped waveform;
- a frequency synthesized signal generator which has a reference signal input terminal to which a reference signal is input, and which outputs a frequency synthesized signal having a frequency obtained by adding or subtracting a frequency equal to a repetition frequency of the signal under test and a frequency that is m times (m: positive integer) a frequency of the reference signal;
- a frequency multiplier which outputs a signal having a frequency that is m times (m: positive integer) the frequency of the reference signal;
- a mixer which mixes the frequency synthesized signal output from the frequency synthesized signal generator with the signal under test;
- a phase comparator which detects a phase difference between a phase of the signal output by the frequency multiplier and a phase of an output signal from the mixer, and which then outputs a phase difference signal;
- a voltage control oscillator which generates the reference signal so as to be phase-synchronized with the signal under test based on the phase difference signal output from the phase comparator, and which feeds the reference signal back to the reference signal input terminal of the frequency synthesized signal generator and to the multiplier; and
- a sampling signal generator circuit which generates the sampling signal by employing the reference signal output from the voltage control oscillator.

17. A waveform measuring apparatus according to claim 16, further comprising:
- a power divider which power divides the signal under test into two optical signals when the signal under test is an optical signal; and
- a clock recovery which detects a clock and a repetition cycle of the clock from one of the two optical signals divided by the power divider, and which converts said one of the two optical signals into an electrical signal of a sine waveform having the repetition frequency of the signal under test.

18. A waveform measuring apparatus according to claim 17, further comprising:
- a photo detector which, when the sampling section is an electro-absorption modulator, light receives the signal under test obtained by sampling one of the two optical signals divided by the power divider by means of the sampling signal generated by the sampling signal generator circuit, and which converts the sampled one of the two optical signals into an electrical signal;
- an analog/digital converter which converts the electrical signal into a digital signal under test, and which delivers the converted digital signal under test to the data processing section; and
- a display which converts a scale of a time axis of the enveloped waveform obtained by the data processing section into an original scale of the signal under test, and which displays the signal waveform of the signal under test.

19. A waveform measuring apparatus comprising:
- a sampling section which samples a signal under test having an input arbitrary repetition cycle by means of a sampling signal having a cycle longer than the repetition cycle of the signal under test;
- a data processing section which obtains an enveloped waveform of the signal under test sampled by means of the sampling section, and which produces a signal waveform of the signal under test from the enveloped waveform;
- a frequency synthesized signal generator which has a reference signal input terminal, and which outputs a frequency synthesized signal having a frequency equal to 1/n (n: positive integer) of a repetition frequency of the signal under test;
- a frequency divider which frequency divides the repetition frequency of the signal under test to 1/n (n: positive integer), and which then outputs the signal under test;
- a phase comparator for detecting a phase difference between a phase of the frequency synthesized signal output from the frequency synthesized signal generator and a phase of the signal under test frequency-divided to 1/n (n: positive integer), and which then outputs a phase difference signal;
- a voltage control oscillator which generates a reference signal that is phase-synchronized with the signal under test based on the phase difference signal output from the phase comparator, and which then feeds the reference signal back to the reference signal input terminal of the frequency synthesized signal generator;
- a sampling signal generator circuit which generates the sampling signal by employing the reference signal output from the voltage control oscillator;
- a frequency measuring section which measures the repetition frequency of the signal under test based on the reference signal output from the voltage control oscillator; and
- a frequency setting section which sets the frequency of the frequency synthesized signal output from the frequency synthesized signal generator based on the repetition frequency of the signal under test measured by the frequency measuring section.

20. A waveform measuring apparatus according to claim 19, further comprising:
- a power divider which power divides the signal under test into two optical signals when the signal under test is an optical signal; and
- a clock recovery which detects a clock and a repetition cycle of the clock from one of the two optical signals divided by the power divider, and which converts said one of the two optical signals into an electrical signal of a sine waveform having the repetition frequency of the signal under test.

21. A waveform measuring apparatus according to claim 20, further comprising:
- a photo detector which, when the sampling section is an electro-absorption modulator, light receives the signal under test obtained by sampling one of the two optical signals divided by the power divider by means of the sampling signal generated by the sampling signal generator circuit, and which converts the sampled one of the two optical signals into an electrical signal;

an analog/digital converter which converts the electrical signal into a digital signal under test, and which delivers the converted digital signal under test to the data processing section; and a display which converts a scale of a time axis of the enveloped waveform obtained by the data processing section into an original scale of the signal under test, and which displays the signal waveform of the signal under test.

22. A waveform measuring apparatus comprising:

a sampling section which samples a signal under test having an input arbitrary repetition cycle by means of a sampling signal having a cycle longer than the repetition cycle of the signal under test;

a data processing section which obtains an enveloped waveform of the signal under test sampled by means of the sampling section, and which produces a signal waveform of the signal under test from the enveloped waveform;

a frequency synthesized signal generator which has a reference signal input terminal to which a reference signal is input, and which outputs a frequency synthesized signal having a frequency obtained by adding or subtracting a frequency equal to a repetition frequency of the signal under test and a frequency that is m times (m: positive integer) a frequency of the reference signal;

a frequency multiplier which outputs a signal having a frequency that is m times (m: positive integer) the frequency of the reference signal;

a mixer which mixes the frequency synthesized signal output from the frequency synthesized signal generator with the signal under test;

a phase comparator which detects a phase difference between a phase of the signal output by the frequency multiplier and a phase of an output signal from the mixer, and which then outputs a phase difference signal;

a voltage control oscillator which generates the reference signal so as to be phase-synchronized with the signal under test based on the phase difference signal output from the phase comparator, and which feeds the reference signal back to the reference signal input terminal of the frequency synthesized signal generator and to the multiplier;

a sampling signal generator circuit which generates the sampling signal by employing the reference signal output from the voltage control oscillator;

a frequency measuring section which measures the repetition frequency of the signal under test based on the reference signal output from the voltage control oscillator; and a frequency setting section which sets the frequency of the frequency synthesized signal output from the frequency synthesized signal generator based on the repetition frequency of the signal under test measured by the frequency measuring section.

23. A waveform measuring apparatus according to claim 22, further comprising:

a power divider which power divides the signal under test into two optical signals when the signal under test is an optical signal; and a clock recovery which detects a clock and a repetition cycle of the clock from one of the two optical signals divided by the power divider, and which converts said one of the two optical signals into an electrical signal of a sine waveform having the repetition frequency of the signal under test.

24. A waveform measuring apparatus according to claim 23, further comprising:

a photo detector which, when the sampling section is an electro-absorption modulator, light receives the signal under test obtained by sampling one of the two optical signals divided by the power divider by means of the sampling signal generated by the sampling signal generator circuit, and which converts the sampled one of the two optical signals into an electrical signal;

an analog/digital converter which converts the electrical signal into a digital signal under test, and which delivers the converted digital signal under test to the data processing section; and a display which converts a scale of a time axis of the enveloped waveform obtained by the data processing section into an original scale of the signal under test, and which displays the signal waveform of the signal under test.

* * * * *